(12) United States Patent
Kuo et al.

(10) Patent No.: US 7,867,809 B2
(45) Date of Patent: Jan. 11, 2011

(54) ONE-STEP DIFFUSION METHOD FOR FABRICATING A DIFFERENTIAL DOPED SOLAR CELL

(75) Inventors: Ming-Chin Kuo, Jhunan Township, Miaoli County (TW); Chin-Chiang Huang, Jhunan Township, Miaoli County (TW); Li-Guo Wu, Jhunan Township, Miaoli County (TW); Jen-Ho Kang, Jhunan Township, Miaoli County (TW); Nai-Tien Ou, Jhunan Township, Miaoli County (TW); Tien-Szu Chen, Jhunan Township, Miaoli County (TW)

(73) Assignee: Gintech Energy Corporation, Miaoli County (TW)

( * ) Notice: Subject to any disclaimer, the term of this patent is extended or adjusted under 35 U.S.C. 154(b) by 0 days.

(21) Appl. No.: 12/396,873

(22) Filed: Mar. 3, 2009

(65) Prior Publication Data

US 2010/0068848 A1 Mar. 18, 2010

(30) Foreign Application Priority Data

Sep. 16, 2008 (TW) .............................. 97135527 A

(51) Int. Cl.
*H01L 21/00* (2006.01)
(52) U.S. Cl. .................. 438/72; 438/542; 257/E21.247
(58) Field of Classification Search .................. 438/542, 438/72; 257/E21.247
See application file for complete search history.

(56) References Cited

U.S. PATENT DOCUMENTS

| 4,131,488 A | 12/1978 | Lesk et al. |
| 4,152,824 A | 5/1979 | Gonsiorawski |
| 2004/0112426 A1 | 6/2004 | Hagino |
| 2009/0142911 A1* | 6/2009 | Asano et al. ................ 438/542 |

FOREIGN PATENT DOCUMENTS

| EP | 1199754 A2 | 4/2002 |
| WO | WO-2007/082760 A1 | 7/2007 |

* cited by examiner

*Primary Examiner*—Matthew S Smith
*Assistant Examiner*—John M Parker
(74) *Attorney, Agent, or Firm*—Muncy, Geissler, Olds & Lowe, PLLC

(57) ABSTRACT

A one-step diffusion method for fabricating a differential doped solar cell is described. The one-step diffusion method includes the following step. First, a substrate is provided. A doping control layer is formed on the substrate. The doping control layer includes a plurality of openings therein. A doping process is conducted on the substrate to form heavy doping regions under the openings of the doping control layer and light doping regions on the other portion of the substrate

9 Claims, 1 Drawing Sheet

ONE-STEP DIFFUSION METHOD FOR FABRICATING A DIFFERENTIAL DOPED SOLAR CELL

RELATED APPLICATIONS

This application claims priority to Taiwan Application Serial Number 97135527, filed Sep. 16, 2008, which is herein incorporated by reference.

FIELD OF THE INVENTION

The present invention generally relates to a method for fabricating a differential doped solar cell. More particularly, this invention relates to a one-step diffusion method for fabricating a differential doped solar cell.

BACKGROUND OF THE INVENTION

The solar cell design in widespread use today has a p/n junction formed near the front surface (a surface which receives the light) which creates an electron flow as light energy is absorbed in the cell. A conventional cell design has one set of electrical contacts on the front side of the cell, and a second set of electrical contacts on the rear side of the solar cell. In a typical photovoltaic module these individual solar cells are interconnected electrically in series to increase the voltage.

This interconnection is typically accomplished by soldering a conductive ribbon from the front side of one solar cell to the rear side of an adjacent solar cell. Therefore, the conventional solar cell adopts a p-type substrate and forms a thin n-type semiconductor layer on the p-type substrate. Before the diffusion process, a surface texturing is formed thereon and then an anti-reflection coating layer is coated to reduce the reflection of the light. Subsequently, a screen printing process is conducted to apply the silver (Ag) paste and the alumina (Al) paste on the surfaces of the wafer by a screen printing technology. After that a fire process is conducted in a high temperature oven to sinter the Al and Ag on the wafer surfaces to form the Al—Si alloy and the Ag—Si alloy on the respective surfaces of the wafer with the ohmic contact. Therefore, the conductive electrodes are formed on the surfaces of the wafer and the conventional solar cell is achieved.

However, while forming the conductive electrodes of the solar cell, a high doping concentration is required to reduce the contact resist on the conductive area. On the contrary, on the emitter area, the doping concentration has to be limited to improve the short wave frequency response for the solar cell. There is a need to balance or choose the doping concentration on the two areas of the solar cell to improve the energy conversion efficiency for the solar cell.

SUMMARY OF THE INVENTION

One objective of the present invention is to provide a method of fabricating a differential doped solar cell to form a high doping concentration in the electrode area and a low doping concentration in the emitter area with one-step diffusion to effectively reduce the manufacturing cost of the solar cell.

To achieve these and other advantages and in accordance with the objective of the present invention, as the embodiment broadly describes herein, the present invention provides a one-step diffusion method for fabricating a differential doped solar cell. The method includes the following steps: providing a substrate; forming a doping control layer on the substrate, wherein the doping control layer comprises a plurality of openings therein; and doping the substrate to form heavily doped regions under the openings and lightly doped regions in an other area.

Afterward, the doping control layer is removed and an anti-reflection coating layer is formed on the substrate. A patterned metal paste is formed on the anti-reflection coating layer and then is heated to form metal electrodes for a solar cell.

The substrate is preferably doped by phosphorus ions, and the sheet resistance of the heavily doped regions is about 10-50 Ohm/sq and the sheet resistance of the lightly doped regions is higher than 50 Ohm/sq. Preferably, the substrate is a p-type substrate and the substrate is doped by n-type ions. In addition, the thickness of the doping control layer is about 5-100 nm, preferably about 10-50 nm, and more preferably about 15-40 nm.

Hence, the one-step diffusion method for fabricating a differential doped solar cell according to the present invention can form the heavily doped regions and the lightly doped regions of the solar cell in a single time doping process. Therefore, the heavily doped regions can be formed at the desired positions for forming the metal electrodes so as to effectively reduce the contact resistance therebetween. The lightly doped regions can be formed on the emitter region of the solar cell to effectively improve the short wave frequency response for the solar cell. Accordingly, the one-step diffusion method for fabricating a differential doped solar cell according to the present invention can effectively improve the open circuit voltage (Voc) and the short circuit current (Isc) for the solar cell.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1D:
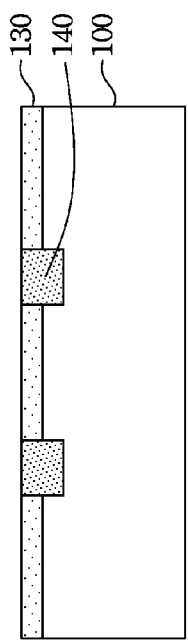
FIGS. 1A to 1E illustrate a preferred embodiment of a one-step diffusion method for fabricating a differential doped solar cell according to the present invention.
Figure 1E:
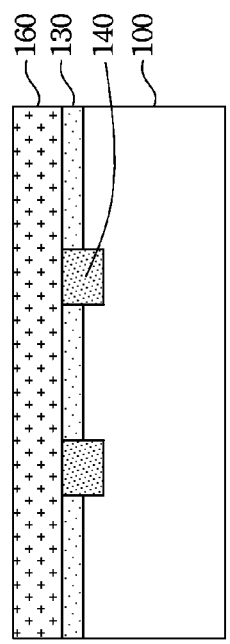
Figure 1A:
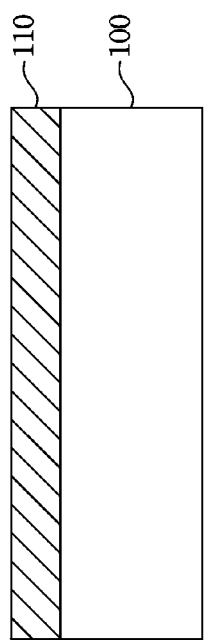
Figure 1B:
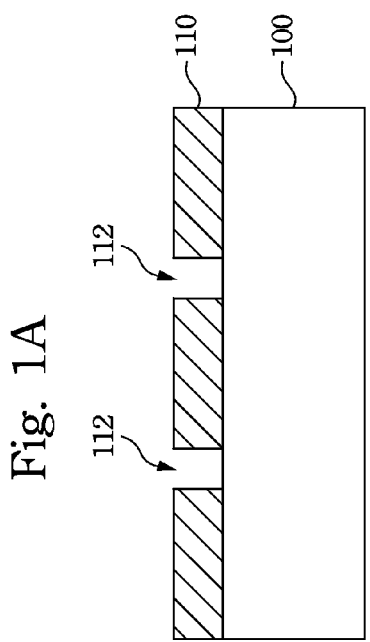

Refer to FIGS. 1A to 1E. A preferred embodiment of a one-step diffusion method for fabricating a differential doped solar cell according to the present invention is illustrated. In FIG. 1A, a doping control layer 110 is formed on a substrate 100 to control the ion concentration in the following doping process to manufacture the solar cell. The doping control layer 110 includes a plurality of openings 112 formed therein to result a high ion concentration without barriers through the openings 112 and a low ion concentration in the other area. Therefore, in the openings 112, the substrate 100 can be doped without any barriers so as to form high ion concentration regions. However, in the other area, the substrate 100 is covered by the doping control layer 110 and therefore doped with barriers so as to form low ion concentration regions. The doping control layer 110, except the openings 112, can allow partial ions passing therethrough and partial ions be trapped therein. Therefore, the lightly doped regions are formed in the substrate 100 covered by the doping control layer 110.

Figure 1C:
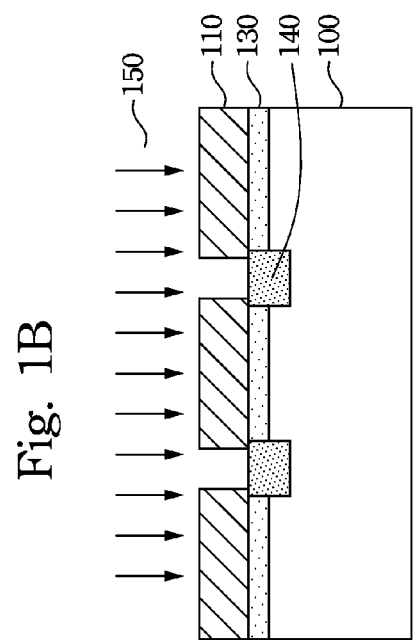

Refer to FIG. 1C. After the doping process 150, heavily doped regions 140 are formed in the substrate 100 underneath and adjacent to the openings 112, and lightly doped regions 130 are formed in the substrate 100 at the other area except underneath and adjacent to the openings 112. Afterward, the doping control layer 110 is removed and an anti-reflection coating layer 160 is formed, referring to FIGS. 1D-1E. At the moment, a preliminary structure for a solar cell is formed on the substrate 100. After the following processes, e.g. the metal paste, such as the silver paste or aluminum paste, screen printing process and the firing process are conducted, a simple solar panel is achieved.

The doping process 150 is, for example, a phosphorus ion doping process. In addition, the substrate 100 is preferably a p-type substrate and an n-type semiconductor layer is formed on the p-type substrate through an ion doping process or a high temperature diffusion process. Furthermore, the lightly doped regions 130 have a low ion concentration while compared with the heavily doped region 140 having a high ion concentration. In a preferred embodiment, the sheet resistance of the heavily doped region 140 is about 10-50 Ohm/sq., and the sheet resistance of the lightly doped regions 130 is higher than 50 Ohm/sq. When the ion concentration of the lightly doped regions 130 is lower than the ion concentration of the heavily doped region 140, a higher energy conversion efficiency of the solar cell and a lower contact resistance for the conductive electrodes of the solar cell can be achieved.

Furthermore, the doping control layer 110 is made of a material, such as the silicon nitride or the silicon oxide, to allow a partial ions passing through. The thickness of the doping control layer 110 is controlled between 5 nm and 100 nm, preferably between 10 nm and 50 nm, and more preferably between 15 nm and 40 nm. Therefore, the doping control layer 110 can control the ions to be doped in the substrate 100 under the openings 112 to form the heavily doped regions 140 and in the other area of the substrate 100, except under and adjacent to the opening 112, to form the lightly doped regions 130 during the same ion doping process. In the heavily doped regions 140, the metal electrodes of the solar cell are formed to effectively reduce the contact resistance between the metal electrodes and the heavily doped regions 140

In the lightly doped regions 130, the emitter regions of the solar cell are formed to effectively improve the short wave frequency response for the solar cell and panel.

The doping control layer 110 can be formed by screen printing etching paste on the silicon nitride layer or the silicon oxide layer and heating the etching paste to form the desired openings 112 in the doping control layer 110. In addition, the doping control layer 110 can also be patterned by the photo-lithography process.

The metal paste, e.g. the silver (Ag) paste or the alumina (Al) paste, is applied on the anti-reflection coating layer 160 and fired at high temperature to etch through the anti-reflection coating layer 160 and form a eutectic structure with the heavily doped regions 140 so as to form metal electrodes for the solar cell and panel.

Accordingly, the one-step diffusion method for fabricating a differential doped solar cell of the present invention can form the heavily doped regions at the desired positions for the metal electrodes to effectively reduce the contact resistance thereof and the lightly doped regions on the emitter regions of the solar cell to effectively improve the short wave frequency response for the solar cell. Therefore, the one-step diffusion method for fabricating a differential doped solar cell of the present invention can effectively improve the open circuit voltage (Voc) and the short circuit current (Isc) for the solar cell.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A one-step diffusion method for fabricating a differential doped solar cell, comprising:
   providing a substrate;
   forming a 5-100 nm doping control layer on the substrate, wherein the doping control layer is made of silicon nitride or silicon oxide and comprises a plurality of openings therein;
   doping the substrate to form heavily doped regions under the openings and lightly doped regions in an other area;
   removing the doping control layer; and
   forming an anti-reflection coating layer on the substrate.

2. The one-step diffusion method for fabricating a differential doped solar cell of claim 1, further comprising:
   forming a patterned metal paste on the anti-reflection coating layer; and
   heating the metal paste to form metal electrodes for a solar cell.

3. The one-step diffusion method for fabricating a differential doped solar cell of claim 1, wherein the substrate is doped by phosphorus ions.

4. The one-step diffusion method for fabricating a differential doped solar cell of claim 1, wherein a sheet resistance of the heavily doped regions is about 10-50 Ohm/sq.

5. The one-step diffusion method for fabricating a differential doped solar cell of claim 4, wherein a sheet resistance of the lightly doped regions is higher than 50 Ohm/sq.

6. The one-step diffusion method for fabricating a differential doped solar cell of claim 1, wherein the substrate is a p-type substrate.

7. The one-step diffusion method for fabricating a differential doped solar cell of claim 6, wherein the substrate is doped by n-type ions.

8. The one-step diffusion method for fabricating a differential doped solar cell of claim 1, wherein a thickness of the doping control layer is about 10-50 nm.

9. The one-step diffusion method for fabricating a differential doped solar cell of claim 1, wherein a thickness of the doping control layer is about 15-40 nm.

* * * * *